(12) United States Patent
Ikeda et al.

(10) Patent No.: US 9,205,669 B2
(45) Date of Patent: Dec. 8, 2015

(54) DRIVING CIRCUIT FOR LIGHT EMITTING ELEMENT, EXPOSURE HEAD, AND IMAGE FORMING APPARATUS

(71) Applicant: CANON KABUSHIKI KAISHA, Tokyo (JP)

(72) Inventors: Kouji Ikeda, Inagi (JP); Masami Iseki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/524,596

(22) Filed: Oct. 27, 2014

(65) Prior Publication Data

US 2015/0116445 A1 Apr. 30, 2015

(30) Foreign Application Priority Data

Oct. 30, 2013 (JP) ................................. 2013-224922

(51) Int. Cl.
- *B41J 2/435* (2006.01)
- *B41J 2/47* (2006.01)
- *B41J 2/45* (2006.01)
- *H01L 27/15* (2006.01)

(52) U.S. Cl.
CPC *B41J 2/45* (2013.01); *H01L 27/153* (2013.01)

(58) Field of Classification Search
CPC ..... H01L 23/48; H01L 23/481; H01L 23/535; H01L 12/523; H01L 27/3202; H01L 27/3203; H01L 27/326; H01L 27/3276

USPC ............ 347/237–240, 247, 251, 255; 257/72, 257/734, 774–776, 784

See application file for complete search history.

(56) References Cited

U.S. PATENT DOCUMENTS

| | | | | |
|---|---|---|---|---|
| 6,081,036 | A | * | 6/2000 | Hirano et al. .................. 257/773 |
| 6,839,045 | B2 | * | 1/2005 | Ozawa et al. ................... 345/92 |
| 2009/0060545 | A1 | * | 3/2009 | Matsuoka et al. .............. 399/51 |
| 2009/0122047 | A1 | * | 5/2009 | Yamamoto et al. ........... 345/211 |

FOREIGN PATENT DOCUMENTS

| | | | |
|---|---|---|---|
| JP | 2011-002502 A | 1/2011 | |
| JP | 2011002502 A | * 1/2011 | ................ G09F 9/30 |

* cited by examiner

*Primary Examiner* — Hai C Pham
(74) *Attorney, Agent, or Firm* — Canon U.S.A., Inc. IP Division

(57) ABSTRACT

Each data line includes base parts covering contact holes and line parts extending in an array direction of pixel circuits and connecting adjacent base parts to each other. The line parts have a smaller width in a direction perpendicular to the array direction than the base parts and are connected to the base parts while being offset in the direction perpendicular to the array direction from each other on both sides of at least two base parts that include first and second base parts. A connection position of the first base part with the line part on one side among both sides of the base units is located on the pixel circuit side with respect to the other side, and a connection position of the second base part on the one side is located on an opposite side to the pixel circuit side with respect to the other side.

12 Claims, 7 Drawing Sheets

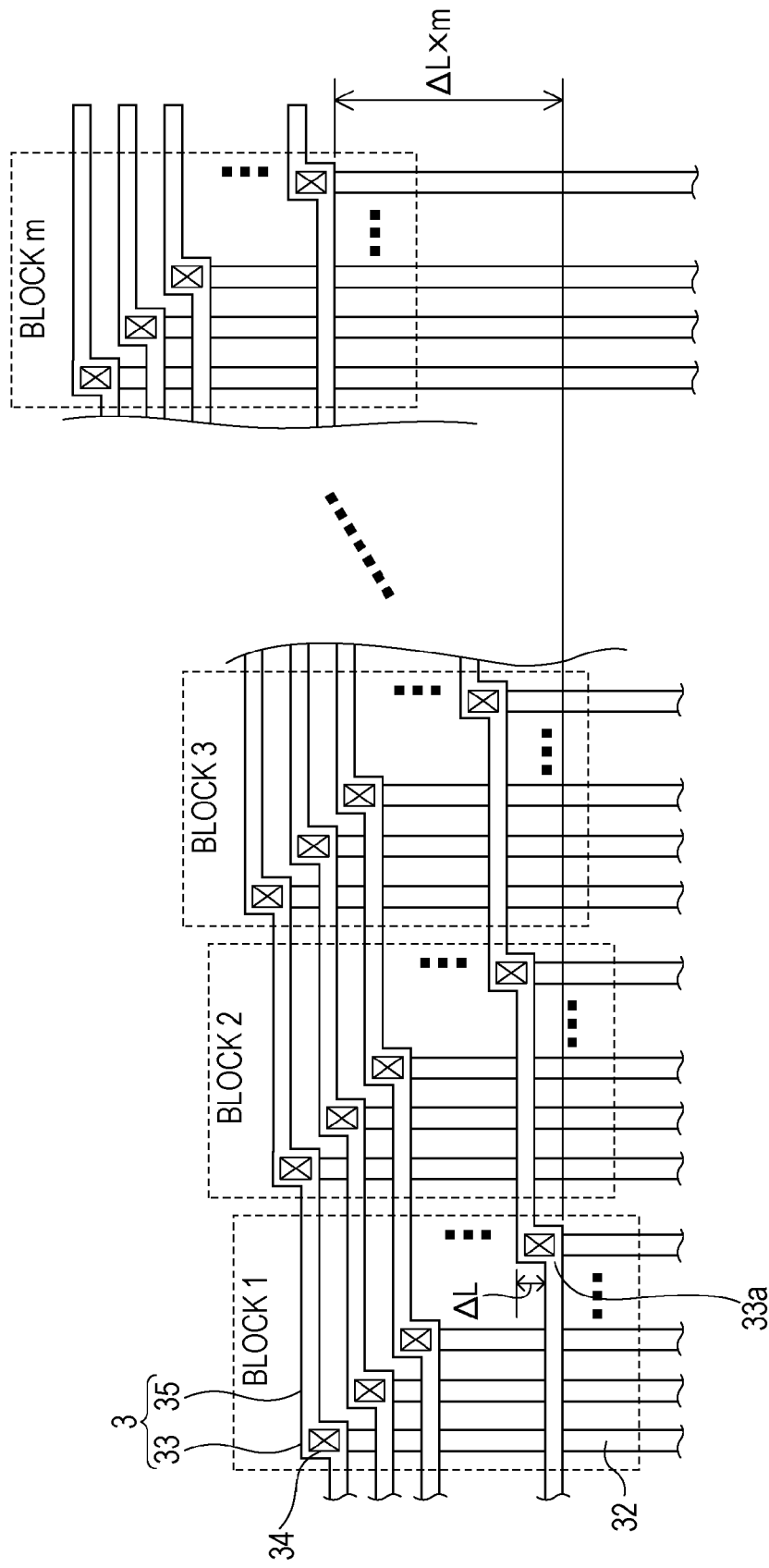

DRIVING CIRCUIT FOR LIGHT EMITTING ELEMENT, EXPOSURE HEAD, AND IMAGE FORMING APPARATUS

BACKGROUND OF THE INVENTION

1. Field of the Invention

The present invention relates to a driving circuit for a light emitting element, an exposure head, and an image forming apparatus.

2. Description of the Related Art

An exposure head that uses light emitting elements such as organic electroluminescence (EL) elements and is mounted to a printer or the like, for example, is constituted by linearly arranging a plurality of pixels having the light emitting elements on a substrate. For that reason, the exposure head has a shape to be elongated in an array direction of the pixels to have a high aspect ratio. At this time, the exposure head preferably has a smaller area as more patterns can be produced at the time of mass production so that costs are reduced. In particular, a variation in the length in a traversal direction significantly affects the area, and this length is preferably set to be shorter as much as possible. At the same time, high speed driving such as an increase in a printing speed is also demanded for the exposure head. To realize these configurations, block driving for collectively writing data to a plurality of pixels by a plurality of data lines is preferably employed.

A plurality of leading lines are connected to a single data line via a contact hole in the block driving. Since a part covering the contact hole by the data lines tends to be wider than the other part, a problem occurs that it is difficult to decrease a distance between the data lines, and it is difficult to reduce the area occupied by the data lines.

Japanese Patent Laid-Open No. 2011-002502 discloses a technology of narrowing line intervals by shifting land parts covering the contact holes in a line lengthwise direction.

However, according to Japanese Patent Laid-Open No. 2011-002502, a first land part is formed so as to protrude from a first line part in only one direction, and a second land part is formed so as to protrude from a second line part in only the same direction as the protrusion of the first land part. For that reason, the interval of the adjacent lines is not sufficiently narrowed. In addition, Japanese Patent Laid-Open No. 2011-002502 does not disclose a manner in which the line interval is narrowed in a case where a plurality of lines each having three or more land parts are arranged.

SUMMARY OF THE INVENTION

The present invention has been made in view of the above-described problems in the related art and provides a driving circuit for a light emitting element in which the area occupied by a plurality of data lines is reduced.

To solve the above-described problems, the present invention provides a driving circuit for a light emitting element, the driving circuit including:

a plurality of pixel circuits aligned in line;

a plurality of data lines which are arranged to extend in parallel to an array direction of the pixel circuits and not to overlap with a region of the aligned pixel circuits and which supply data signals to the pixel circuits; and a plurality of leading lines that are arranged on a layer different from the data lines and connected to the data lines via contact holes and to the pixel circuits, in which each of the plurality of data lines includes a plurality of base parts that cover the contact holes and a plurality of line parts that extend in the array direction of the pixel circuits and connect adjacent base parts to each other, and the line parts have a smaller width in the direction perpendicular to the array direction of the pixel circuits than the base parts and are connected to the base parts while being offset in the direction perpendicular to the array direction of the pixel circuits from each other on both sides of at least two base parts, and the at least two base parts include a first base part and a second base part, a connection position of the first base part with the line part on one side among both sides of the base units being located on the pixel circuit side with respect to the other side, and a connection position of the second base part with the line part on the one side among the both sides of the base units being located on an opposite side to the pixel circuit side with respect to the other side.

Further features of the present invention will become apparent from the following description of exemplary embodiments with reference to the attached drawings.

BRIEF DESCRIPTION OF THE DRAWINGS

FIG. 7 illustrates details of a partial data line part.

DESCRIPTION OF THE EMBODIMENTS

Hereinafter, the present invention will be described in detail by using the drawings.

Driving Circuit for Light Emitting Element and Exposure Head

Figure 1:
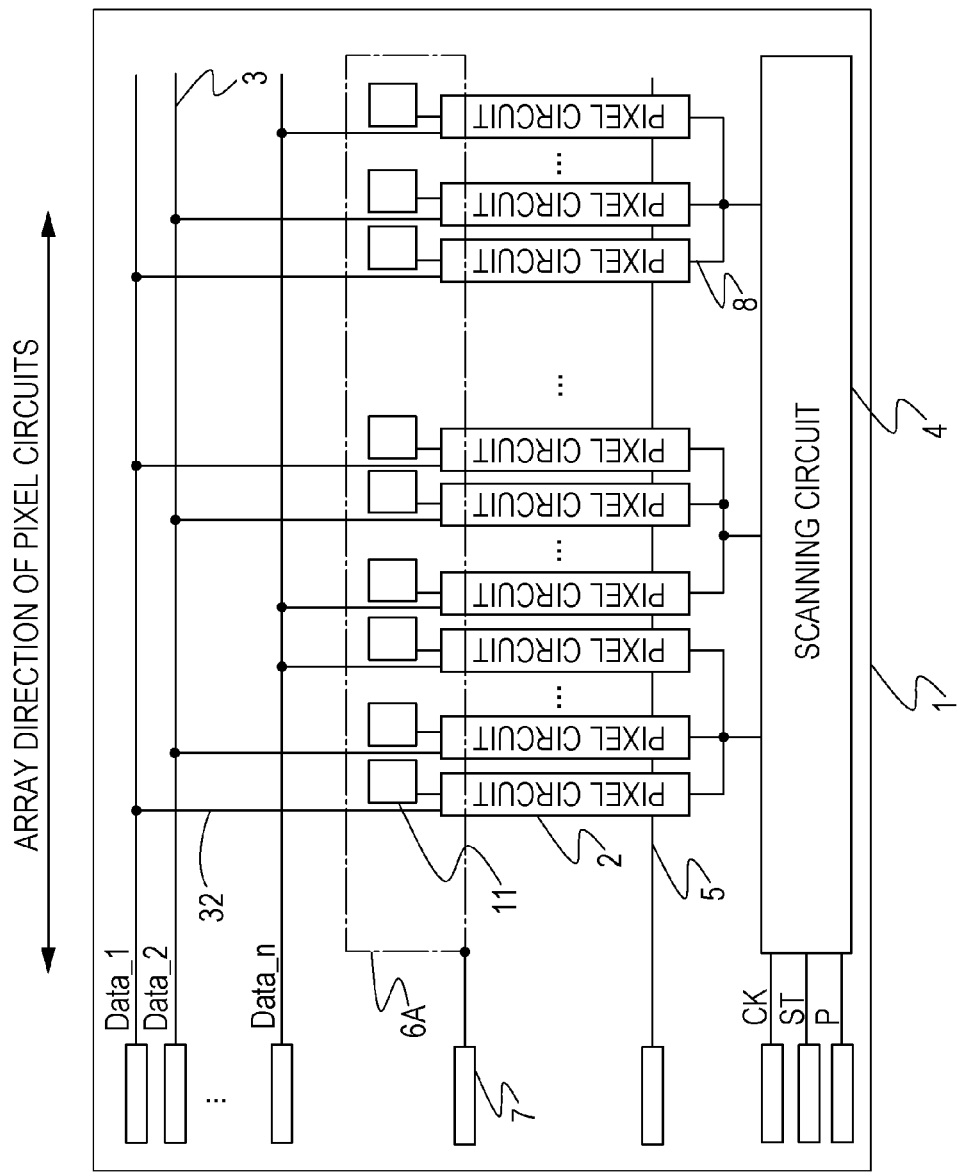
FIG. 1 is a schematic diagram of an example configuration of an exposure head that uses a driving circuit for a light emitting element according to an exemplary embodiment of the present invention.
Figure 2:
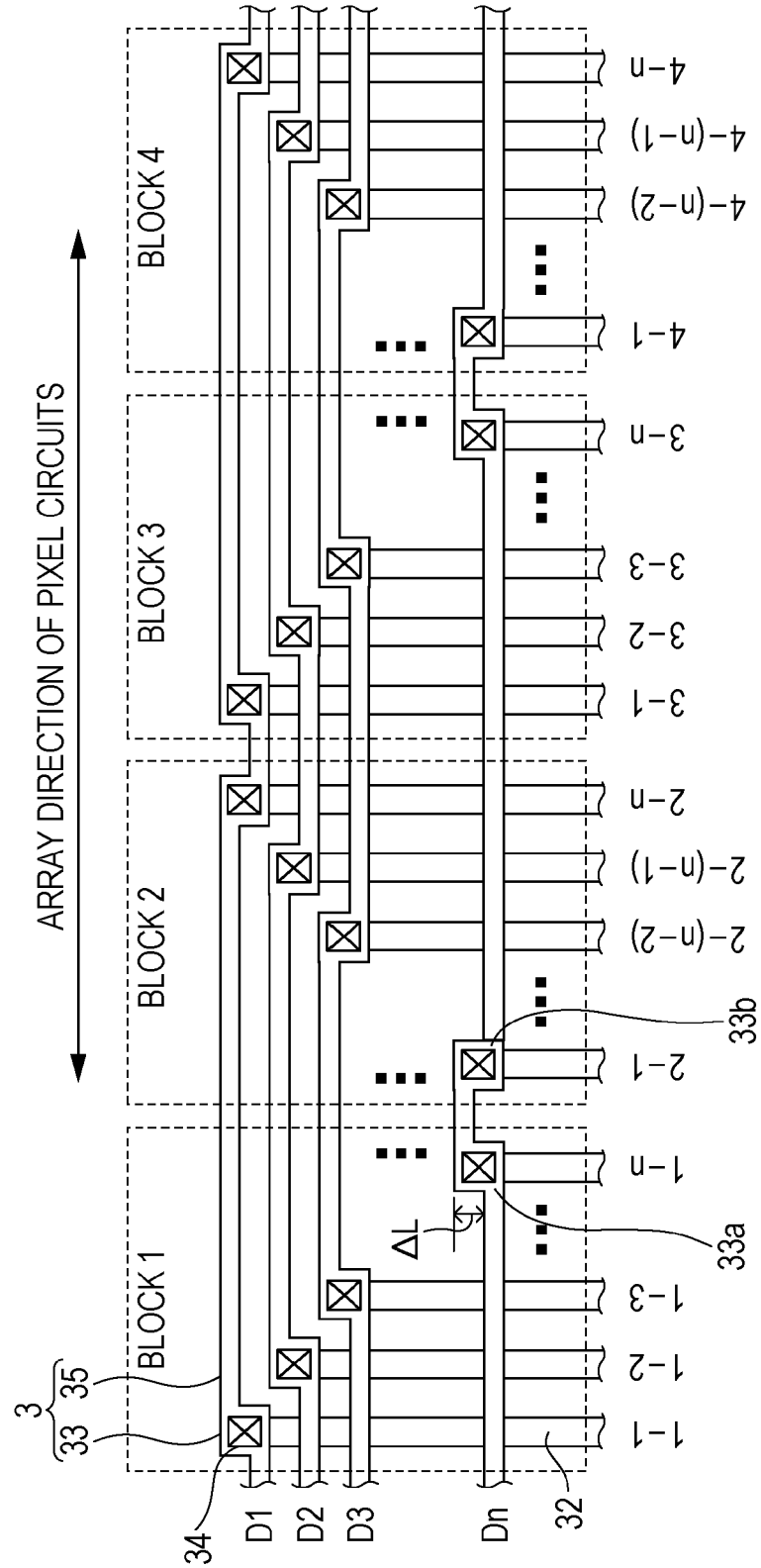
FIG. 2 illustrates details of a partial data line part of FIG. 1.

An example in which a driving circuit for a light emitting element according to an exemplary embodiment of the present invention is used as an exposure head that irradiates a photosensitive drum with light to expose a latent image will be described by using FIG. 1 and FIG. 2. FIG. 1 is a schematic diagram of an example configuration of an exposure head that uses a driving circuit for a light emitting element according to an embodiment of the present invention. FIG. 2 illustrates details of a partial data line part of FIG. 1.

As illustrated in FIG. 1, the exposure head according to the embodiment of the present invention is constituted by forming a plurality of pixel circuits 2 to be arranged in one direction on a substrate 1. For example, a glass substrate, a silicon substrate, or the like can be used as the substrate 1. A light emitting element 11 is connected to each of the pixel circuits 2, and the pixel circuit 2 and the light emitting element 11 constitute a pixel. The light emitting elements 11 are arranged so as to be aligned in line in an array direction of the pixel circuits 2, but the light emitting elements 11 may be arranged, for example, in a zigzag alignment or the like without being aligned in line, and dummy light emitting elements may be arranged in plural lines. For example, a light emitting diode (LED), an inorganic EL element, an organic EL element, or the like may be used as the light emitting element 11.

With regard to the pixel circuits 2, a length in a direction perpendicular to the array direction of the pixel circuits 2 is longer than a length in the array direction of the pixel circuits 2. The pixel circuits 2 illustrated in FIG. 1 substantially have a rectangular shape. The pixel circuits 2 are divided into a plurality of blocks constituted by a plurality of adjacent pixel circuits. Specifically, n pieces (n is an integer higher than or equal to 2 and is preferably 3 or higher) of the adjacent pixel circuits 2 are grouped as one block. Then, m blocks (m is an integer higher than or equal to 2 and is preferably 3 or higher) are arranged in total. Furthermore, the respective blocks are aligned in line in the same direction as the array direction of the pixel circuits 2.

A data line 3 is a line on which a data signal is transmitted. The data line 3 is arranged in a region on an extension line in the direction perpendicular to the array direction of the pixel circuits 2. According to the present exemplary embodiment, n data lines 3 corresponding to the number of the pixel circuits 2 constituting one block are aligned. The data line 3 and the pixel circuit 2 are connected to each other via a leading line 32. According to the present exemplary embodiment, m leading lines 32 corresponding to the number of blocks are connected to one data line 3, and the data signal is supplied to the pixel circuits 2 in the respective blocks. According to the present exemplary embodiment, the leading lines 32 extend in the direction perpendicular to the array direction of the pixel circuits 2. It is noted that in FIG. 1, the data line 3 is represented by a straight line extending in the array direction of the pixel circuits 2 but has a shape illustrated in FIG. 2 in actuality. Details of the data line 3 will be described below.

Controls signals such as a clock signal CK, CKB, a data signal ST, and P are input to a scanning circuit 4. The scanning circuit 4 outputs a scanning signal to a scanning line 8 for each block to supply the pixel circuits with the scanning signal. The scanning circuit 4 includes shift registers, and the scanning signals are output in units of blocks while timing points are shifted. The shift registers in the scanning circuit 4 are arranged such that the signals travel in the array direction of the pixel circuits 2. It is noted that FIG. 1 illustrates the configuration in which the scanning signal is input to the pixel circuit 2 by one scanning line 8, but the number of the scanning lines 8 is not limited to this.

A power supply voltage is supplied to all the pixel circuits 2 and the light emitting elements 11 via a first power supply line 5 and a second power supply line. A plurality of second power supply lines are arranged in a region 6A, and the region 6A is arranged so as to be overlapped with the light emitting elements 11 and the pixel circuits 2. The second power supply lines are formed on a layer different from the data lines 3, the leading lines 32, and the lines of the pixel circuits 2 in the region 6A. The above-described signals and power supply voltage are supplied onto the substrate 1 by respective terminal parts 7. It is noted that the second power supply lines are transferred to the other layer in the vicinity of the terminal parts 7 to be connected to the terminal parts 7.

FIG. 2 illustrates details of a part equivalent to four blocks of the data line parts in FIG. 1. As described above, the pixel circuits 2 are divided into the m blocks each constituted by the n adjacent pixel circuits. In FIG. 2, the pixel circuit belonging to Block 1 are sequentially denoted as 1-1, 1-2, ..., 1-n from the left side towards the paper plane. The same applies to Block 2 and subsequent blocks, and FIG. 2 illustrates blocks up to Block 4. As illustrated in FIG. 2, the driving circuit according to the exemplary embodiment of the present invention includes n data lines 3 (D1 to Dn) corresponding to the number of the pixel circuits 2 constituting one block. The leading lines 32 that connect the data lines 3 to the pixel circuits 2 are arranged on a layer different from the data lines 3 via an insulating layer and are connected to the data lines 3 via contact holes 34 formed on the insulating layer. Each of the plurality of data lines 3 includes a plurality of base parts 33 covering the contact holes 34 and a plurality of line parts 35 extending in the array direction of the pixel circuits 2 and connecting the adjacent base parts 33 to each other. According to the present exemplary embodiment, each of the data lines 3 includes m base parts 33 corresponding to the number of blocks and is connected to the m leading lines 32. Specifically, as illustrated in FIG. 2, a data line D1 is connected to a leading line connected to a pixel circuit 1-1 in the Block 1, a leading line connected to a pixel circuit 2-n in the Block 2, ..., and a leading line connected to the pixel circuit (m−1 in a case where m is an odd number or m−n in a case where m is an even number) in the Block m. The same applied to a data line D2 and subsequent data lines. That is, one leading line to one block extends from one data line 3.

The line parts 35 are constituted by a low-resistance line layer such as aluminum lines and have a smaller width in the direction perpendicular to the array direction of the pixel circuits 2 than the base parts 33. The line parts 35 are offset on both sides of at least two base parts 33 (all the base parts 33 according to the present exemplary embodiment) from each other in the direction perpendicular to the array direction of the pixel circuits 2 to be connected to the base parts 33. For that reason, the mutual base parts 33 of the adjacent data lines 3 are arranged while being shifted in the array direction of the pixel circuits 2 from each other, so that a distance between the adjacent data lines can be shortened as compared with a case where the line parts 35 are connected without being offset on the both sides of the base parts 33 from each other (central axes are matched to each other). From the above-described viewpoint, as illustrated in FIG. 2, the line parts 35 are connected to be flush with the base parts 33 on the both sides of the base parts 33.

The base part 33 includes a first base part 33a and a second base part 33b. A connection position of the first base part 33a with the line part 35 on one side of the base part 33 (left side towards the paper plane in FIG. 2) is located on a pixel circuit 2 side with respect to the other side (right side towards the paper plane in FIG. 2). A connection position of the second base part 33b on the one side (left side towards the paper plane in FIG. 2) is located on an opposite side to the pixel circuit 2 side with respect to the other side (right side towards the paper plane in FIG. 2).

To shorten the distance between the adjacent data lines 3, the mutual base parts nearest to the adjacent data lines 3 are preferably both the first base parts 33a or both the second base parts 33b. In FIG. 2, the base parts 33 to which the leading lines 32 connected to the pixel circuits 2 belonging to the same block are connected are unified to be either the first base parts 33a or the second base parts 33b.

At this time, it is assumed that the base parts are only the first base parts 33a as illustrated in FIG. 7. The mutual line parts 35 are shifted in the direction perpendicular to the array direction of the pixel circuits 2 from each other by a difference (ΔL) of line widths of the base part 33 and the line part 35 on both sides of one base part. Since the data line 3 includes the m base parts, the mutual line parts 35 on both ends are shifted in the direction perpendicular to the array direction of the pixel circuits 2 from each other by ΔL×m. Therefore, even if the distance between the adjacent data lines 3 is short, an extra region occupied by the data lines corresponding to ΔL×m needs to be secured. The light emitting elements 11 and the pixel circuits 2 arranged to be adjacent to the data lines 3 are preferably aligned in line so as to be parallel to the long side of the substrate 1. In these parts, it is also difficult to effectively use the shifted space corresponding to ΔL×m. The same also applies to a case where the base parts are only the second base parts 33b.

In contrast to this, the base part 33 includes the first base part 33a and the second base part 33b in the driving circuit according to the exemplary embodiment of the present invention. For that reason, the first base part 33a and the second base part 33b mutually counterbalance a shift amount of the line parts 35, and the region occupied by the data lines can be reduced. In FIG. 2, each of the data lines 3 alternately includes the first base part 33a and the second base part 33b. For that reason, the shift amount of the mutual line parts 35 on both ends is 0 in a case where the block number m is an even number or ΔL in a case where the block number m is an odd number. To minimize the shift amount of the mutual line parts 35 on the both ends, each of the data lines 3 preferably has the same numbers of the first base part 33a and the second base part 33b. It is however noted that, when at least one of the first base part 33a and at least one of the second base part 33b are prepared, even if the numbers of the first base part 33a and the second base part 33b are different from each other, the effect of counterbalancing the shift amount can be obtained, and it is possible to reduce the region occupied by the data lines.

Figure 4:
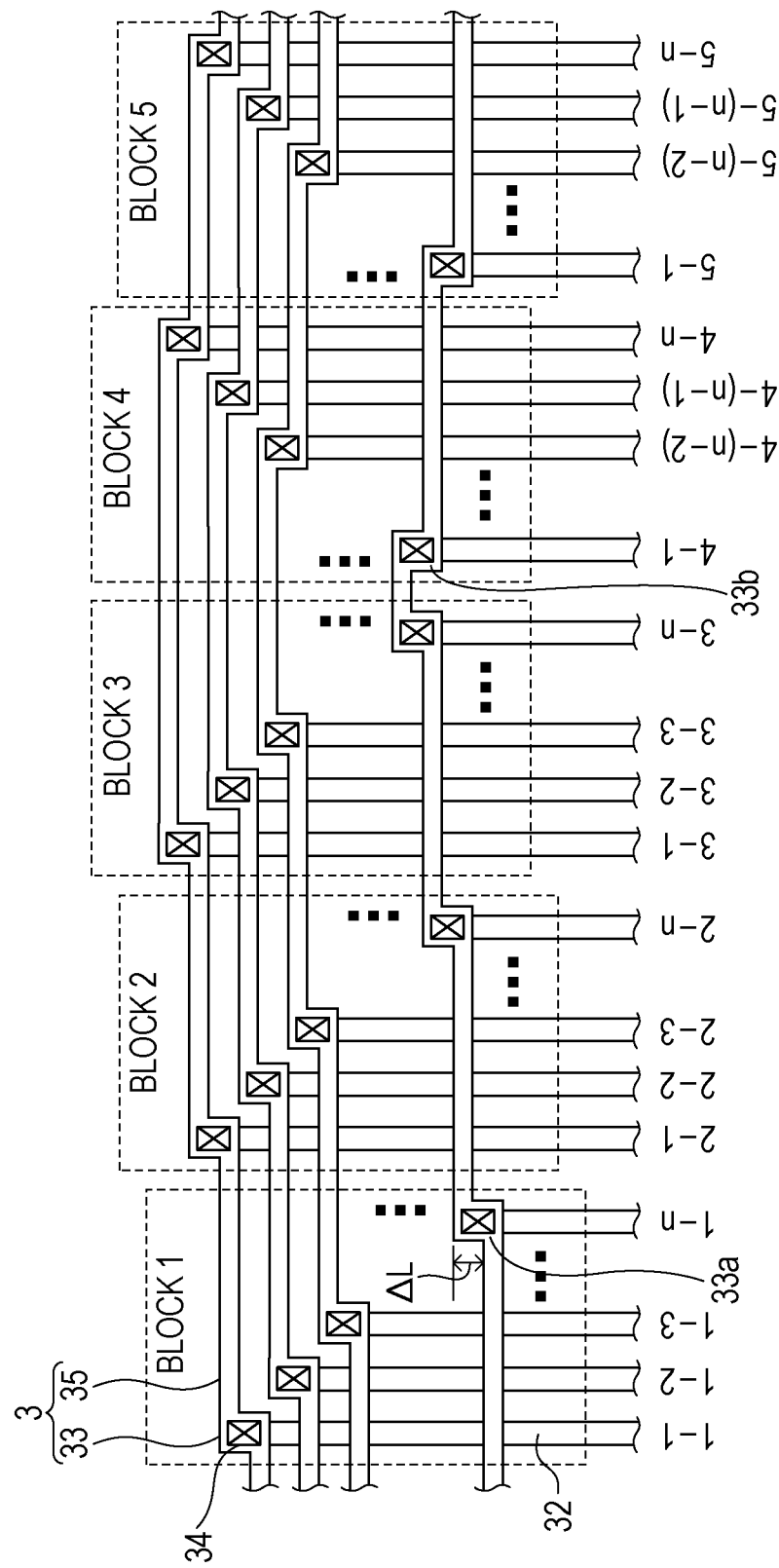
FIG. 4 illustrates another example of the detail of the partial data line part.

The arrangement of the first base parts 33a and the second base parts 33b is not limited to the arrangement illustrated in FIG. 2, and for example, as illustrated in FIG. 4, the first base parts 33a or the second base parts 33b may be continuously arranged.

Figure 3:
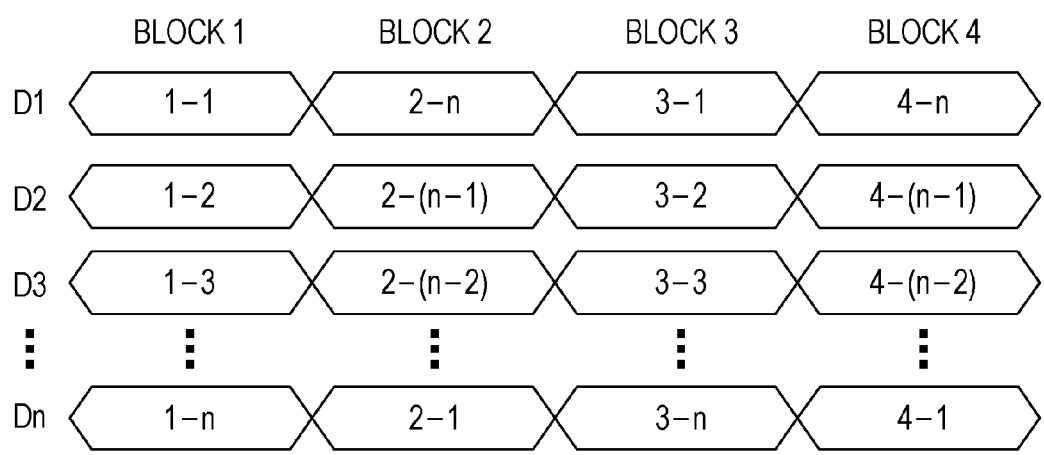
FIG. 3 is a timing chart for data transmitted to the data line of FIG. 2.

Next, a method of performing data writing from the data line of the driving circuit according to the exemplary embodiment of the present invention will be described while the case of FIG. 2 is used as an example. FIG. 3 is a timing chart for data transmitted to the data line of FIG. 2.

To write data in each block in sequence like the Block 1, the Block 2, . . . , the Block m, the data is transmitted to the relevant pixel circuits 2 connected to the respective data lines 3. In general, the data is transmitted from the data line D1 in any block in the pixel circuits 2 (1-1, 2-1, . . . , m-1) on the left end towards the paper plane in the block. However, according to the mode of FIG. 2, the data line D1 is connected to the pixel circuit 1-1 in the Block 1 but is connected to the pixel circuit 2-n in the Block 2. Similarly, the data line Dn is connected to the pixel circuit 1-n in the Block 1 but is connected to the pixel circuit 2-1 in the Block 2. Therefore, the k-th data is written to the k-th data line (k is a natural number higher than or equal to 1 and lower than or equal to n) in the block to which the pixel circuits 2 connected to the base parts 33 unified to be one group among a group of the first base parts 33a or a group of the second base parts 33b belong. The [n-(k-1)]-th data is written to the k-th data line in the block to which the pixel circuits 2 connected to the base parts 33 unified to be the other group belong. Specifically, the data is transmitted to the data line 3 from the first in ascending sequence in the odd-numbered block, and the data is transmitted to the data line 3 from the n-th in descending sequence in the even-numbered block.

Figure 5:
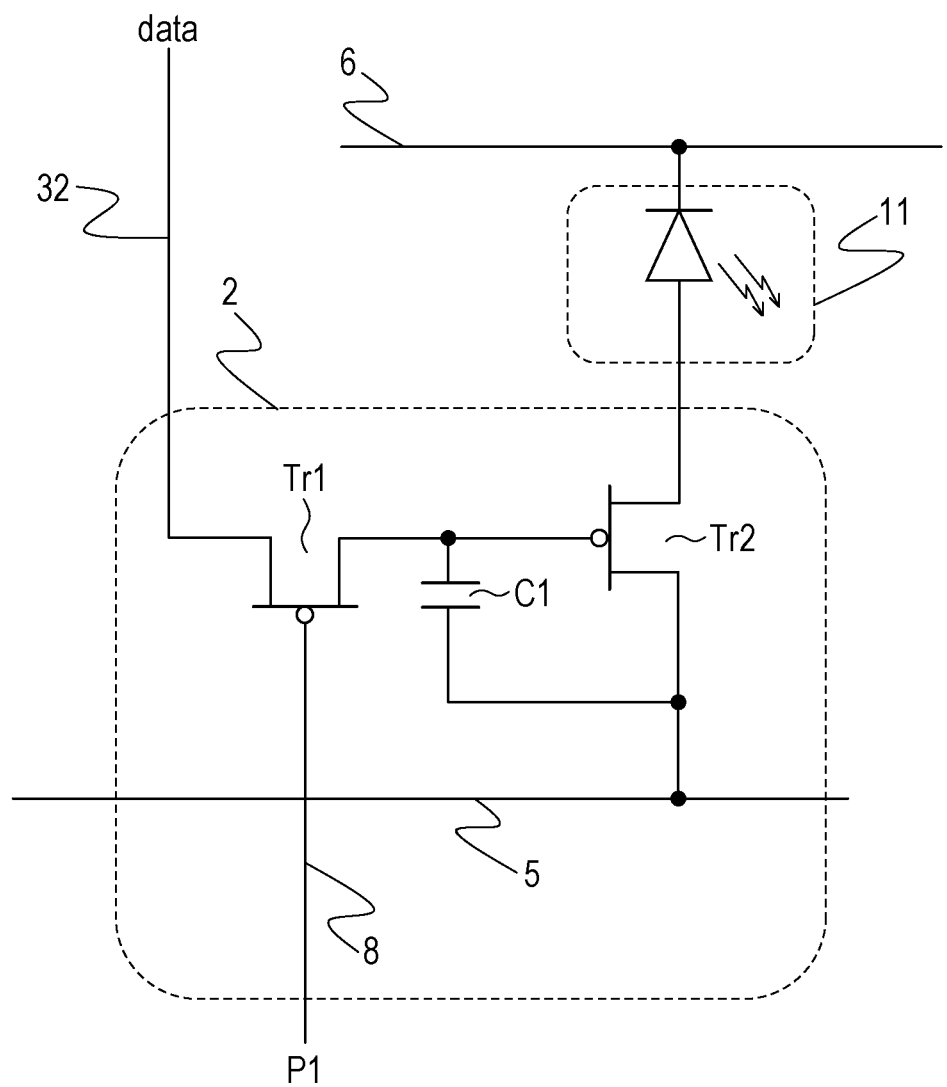
FIG. 5 illustrates an example circuit for a pixel.

FIG. 5 illustrates an example circuit for a pixel constituted by the pixel circuit 2 and the light emitting element 11. A circuit configuration will be described. The pixel circuit 2 is constituted by two PMOS transistors and one holding capacitance C1. A scanning signal P1 is input to a gate electrode of a switching transistor Tr1 corresponding to a selection transistor, and the leading line 32 is connected to one of a source and a drain. The other end of the source or the drain is connected to a gate of a driving transistor Tr2. A source of the driving transistor Tr2 is connected to the first power supply line 5, and a drain thereof is connected to an anode electrode of the light emitting element 11. The holding capacitance C1 is arranged between the gate and the source of the driving transistor Tr2 and holds the data voltage written in the pixel circuit 2. Furthermore, a cathode of the light emitting elements 11 is connected to a second power supply line 6 corresponding to a common potential commonly provided to all the pixels. One of the anode electrode and the cathode electrode is set as a light retrieval surface and is therefore constituted by a transparent electrode (for example, indium tin oxide (ITO), indium zinc oxide (IZO), or the like).

Circuit operation will be described. The switching transistor Tr1 is turned ON at the timing point when the data corresponding to the relevant pixel is set onto the data line 3. Subsequently, the data is written in the holding capacitance C1. After that, the switching transistor Tr1 is turned OFF, so that the data is held in the pixel circuits 2. At the same time, a driving current in accordance with a gate-source voltage of the driving transistor Tr2 flows from the driving transistor Tr2 to the light emitting element 11. According to the present exemplary embodiment, the example in which the pixel circuit 2 is constituted by the PMOS has been illustrated, but the configuration is not limited to this transistor (Tr) polarity. Specifically, a circuit constituted by a single channel of an NMOS or a circuit where the NMOS and the PMOS both exist may also be used.

According to the above-described exemplary embodiment, a type of the light emitting element is not limited, but the present invention is preferably used for a driving circuit that controls lighting of the organic EL element, in particular, a driving circuit where the block driving is performed. In addition, the example in which the light emitting elements are used for the exposure head has been described, but the present invention can also be applied to a driving circuit for a linear light source in which the light emitting elements are arranged in line or an active matrix type display, or the like.

Image Forming Apparatus

Figure 6:
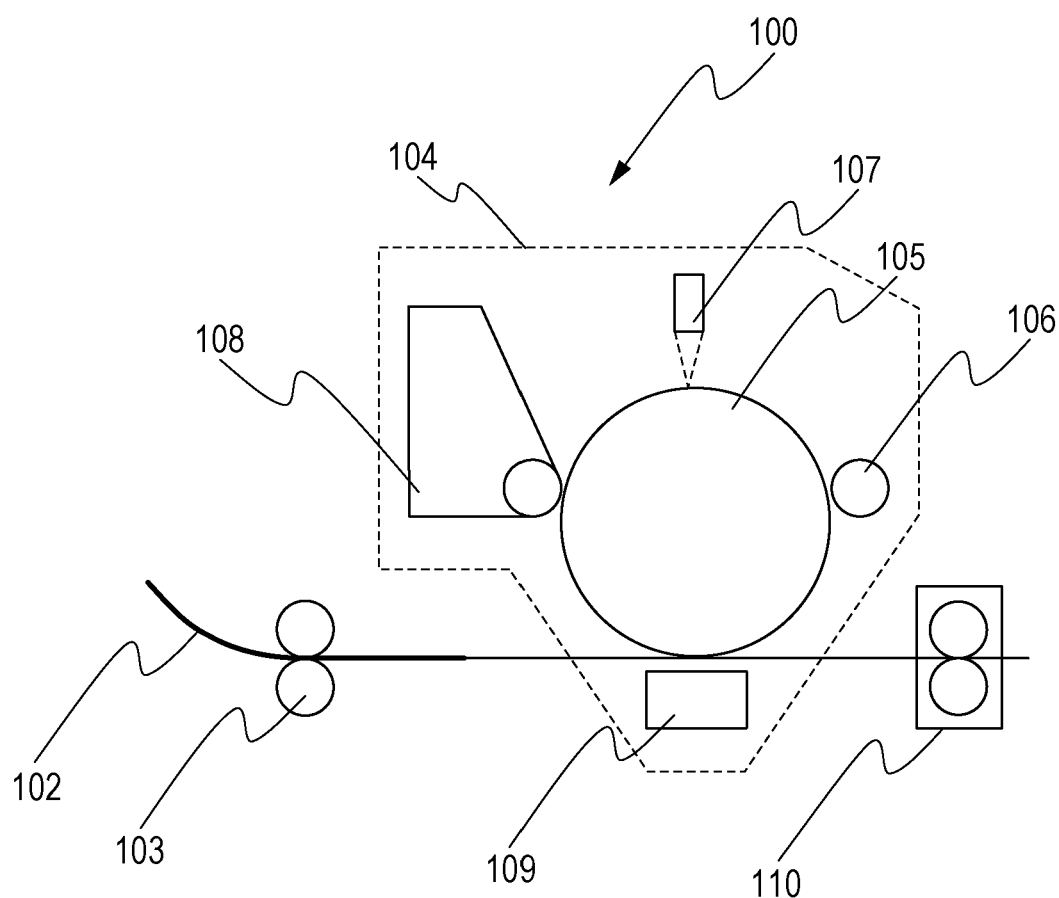
FIG. 6 is a schematic diagram of an image forming apparatus including the exposure head that uses the driving circuit for the light emitting elements according to the exemplary embodiment of the present invention.

An image forming apparatus provided with the exposure head that uses the driving circuit for the light emitting elements according to the embodiment of the present invention will be described by using FIG. 6. An image forming apparatus 100 includes a recording unit 104. The recording unit 104 is provided with a photosensitive drum 105, a charger 106, an exposure head 107 provided with the driving circuit for the light emitting elements according to the embodiment of the present invention, a developer 108, and a transfer device 109. The image forming apparatus 100 further includes a conveyance roller 103 and a fuser 110.

First, in the recording unit 104, a front face of the cylindrical photosensitive drum 105 is uniformly charged by the charger 106, and the exposure head 107 emits light in accordance with data to form an electrostatic latent image on the photosensitive drum 105. The electrostatic latent image can be controlled by the exposure amount (illuminance, time) of the exposure head 107. Next, in the recording unit 104, toner is adhered to the electrostatic latent image by the developer 108, and the toner adhered to the electrostatic latent image is transferred to a sheet 102 by the transfer device 109. In this manner, the toner on the sheet 102 on which the image data is transferred via the recording unit 104 is fused by the fuser 110, and the sheet 102 is discharged. It is noted that the timing point at which the sheet 102 is conveyed to the recording unit 104 by the conveyance roller 103 can be arbitrarily set. According to the present exemplary embodiment, the description has been given while taking the example in which the recording unit 104 is the single monochrome image forming apparatus, but the configuration is not limited to this. A color image forming apparatus provided with a plurality of recording units 104 may also be used.

According to the present exemplary embodiment of the present invention, the area occupied by the data lines is small, so that the substrate size can be reduced, and the frame can be narrowed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-224922, filed Oct. 30, 2013, which is hereby incorporated by reference herein in its entirety.

What is claimed is:

1. A driving circuit for a light emitting element, the driving circuit comprising:
a plurality of pixel circuits aligned in line;
a plurality of data lines which are arranged to extend in parallel to an array direction of the pixel circuits and not to overlap with a region of the aligned pixel circuits and which supply data signals to the pixel circuits; and
a plurality of leading lines that are arranged on a layer different from the data lines and connected to the data lines via contact holes and to the pixel circuits,
wherein each of the plurality of data lines includes a plurality of base parts that cover the contact holes and a plurality of line parts that extend in the array direction of the pixel circuits and connect adjacent base parts to each other, and the line parts have a smaller width in the direction perpendicular to the array direction of the pixel circuits than the base parts and are connected to the base parts while being offset in the same direction perpendicular to the array direction of the pixel circuits from each other on both sides of at least two base parts, and
wherein the at least two base parts include a first base part and a second base part, a connection position of the first base part with the line part on one side among both sides of the base units being located on the pixel circuit side with respect to the other side, and a connection position of the second base part with the line part on the one side among the both sides of the base units being located on an opposite side to the pixel circuit side with respect to the other side.

2. The driving circuit for the light emitting element according to claim 1, wherein the mutual base parts for the adjacent data lines are arranged while being shifted in the array direction of the pixel circuits from each other.

3. The driving circuit for the light emitting element according to claim 1, wherein the line parts are connected to be flush with the base parts on both sides of opposite periphery of the base parts.

4. The driving circuit for the light emitting element according to claim 1, wherein each of the plurality of data lines alternately includes the first base part and the second base part.

5. The driving circuit for the light emitting element according to claim 1, wherein each of the plurality of data lines includes the same numbers of the first base parts and the second base parts.

6. The driving circuit for the light emitting element according to claim 1, wherein the leading lines extend in the direction perpendicular to the array direction of the pixel circuits.

7. The driving circuit for the light emitting element according to claim 1, wherein the plurality of pixel circuits are divided into a plurality of blocks each constituted by a plurality of adjacent pixel circuits, and the base parts to which the leading lines connected to the pixel circuits belonging to the same block are connected are unified to be the first base parts or the second base parts.

8. The driving circuit for the light emitting element according to claim 7, wherein the number of pixel circuits belonging to the block is n, the k-th data is written to the k-th data line where k is a natural number higher than or equal to 1 and lower than or equal to n in a block to which the pixel circuits connected to the base parts unified to be one group among a group of the first base parts and a group of the second base parts belong, and the [n−(k−1)]-th data is written to the k-th data line in a block to which the pixel circuits connected to the base parts unified to be the other group among the group of the first base parts and the group of the second base parts belong.

9. The driving circuit for the light emitting element according to claim 1, wherein the pixel circuit includes
a driving transistor configured to supply a driving current to the light emitting element connected to the pixel circuit, and
a selection transistor configured to supply a data signal supplied via the data line, to the driving transistor.

10. The driving circuit for the light emitting element according to claim 9, further comprising:
a scanning circuit,
wherein a scanning line connected to the scanning circuit is connected to a gate electrode of the selection transistor, and a control signal is transmitted through the scanning line.

11. An exposure head comprising the driving circuit for the light emitting element according to claim 1.

12. An image forming apparatus comprising the exposure head according to claim 11.

* * * * *